United States Patent
Komurasaki et al.

(10) Patent No.: US 6,791,413 B2
(45) Date of Patent: Sep. 14, 2004

(54) VARIABLE GAIN AMPLIFIER WITH A GAIN EXHIBITING A LINEAR IN DB CHARACTERISTIC RELATIVE TO A CONTROL VOLTAGE

(75) Inventors: Hiroshi Komurasaki, Hyogo (JP); Hisayasu Satoh, Hyogo (JP); Kinya Hosoda, Saitama (JP); Akira Hyogo, Chiba (JP); Keitaro Sekine, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/383,568

(22) Filed: Mar. 10, 2003

(65) Prior Publication Data

US 2004/0046608 A1 Mar. 11, 2004

(30) Foreign Application Priority Data

Sep. 10, 2002 (JP) ........................................ 2002-264124

(51) Int. Cl.[7] ................................................ H03F 3/45
(52) U.S. Cl. ........................................ 330/254; 330/253
(58) Field of Search ................................ 330/254, 253, 330/257; 327/359

(56) References Cited

U.S. PATENT DOCUMENTS 6,163,215 A * 12/2000 Shibata et al. .............. 330/254
6,552,611 B2 * 4/2003 Yamamoto .................. 330/253
6,566,951 B1 * 5/2003 Merrigan et al. ........... 330/254

OTHER PUBLICATIONS

Po–Chiun Huang et al., "A 3.3–V CMOS Wideband Exponential Control Variable–Gain–Amplifier," Circuits and Systems, 1998, ISCAS '98, Proceedings of the 1998 IEEE International Symposium on May 31–Jun. 3, 1998, vol. 1, pp. 285–288.

* cited by examiner

*Primary Examiner*—Henry Choe
(74) *Attorney, Agent, or Firm*—Burns, Doane, Swecker & Mathis, L.L.P.

(57) ABSTRACT

A variable gain amplifier is configured of an amplification circuit and a control circuit controlling a gain of the amplification circuit. The amplification circuit has first and second MOS transistors identical in characteristics and having respective sources connected to a first fixed potential. The amplification circuit has a differential gain proportional to a square root of a ratio between a current flowing through the first MOS transistor and a current flowing through the second MOS transistor. The control circuit applies a potential corresponding to a constant voltage plus a control voltage to a gate of the first MOS transistor and a potential corresponding to the constant voltage minus the control voltage to a gate of the second MOS transistor.

8 Claims, 6 Drawing Sheets

$Y1=\left(\dfrac{1+x}{1-x}\right)^{0.5}$ $\quad$ $Y3=\left(\dfrac{1+x}{1-x}\right)$ $Y2=\exp(x)$ $\quad$ $Y4=\exp(2x)$

VARIABLE GAIN AMPLIFIER WITH A GAIN EXHIBITING A LINEAR IN DB CHARACTERISTIC RELATIVE TO A CONTROL VOLTAGE

BACKGROUND OF THE INVENTION

1. Field of the Invention

The present invention relates generally to variable gain amplifiers and particularly to linear gain amplifiers.

2. Description of the Background Art

Figure 5:
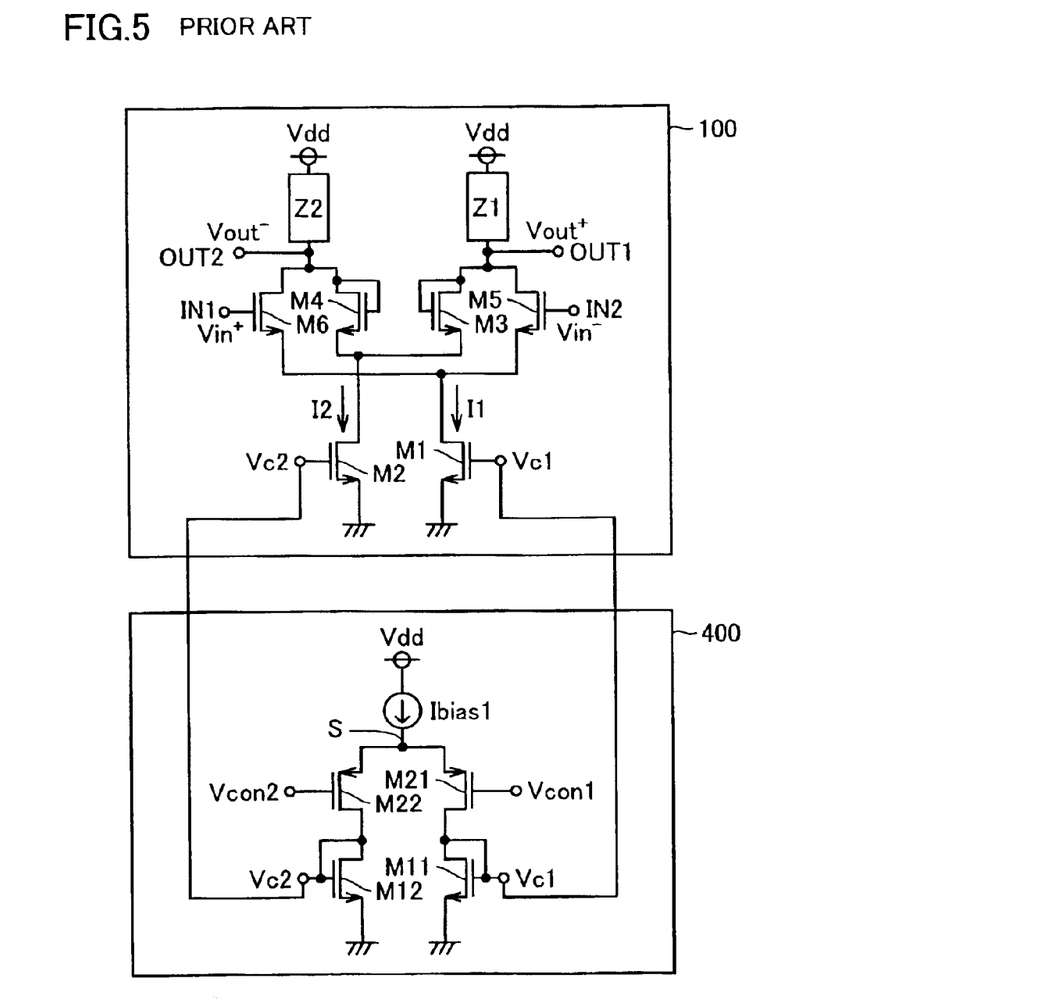
FIG. 5 shows a configuration of a conventional variable gain amplifier.

FIG. 5 shows a variable gain amplifier configured of an amplification circuit 100 and a control circuit 400 controlling a gain of amplification circuit 100. Amplification circuit 100 is configured, as described hereinafter. Amplification circuit 100 includes n-channel MOS transistors M1–M6 (first to sixth MOS transistors, respectively), and load resistances Z1 and Z2 (first and second load resistances, respectively). Herein, transistors M1 and M2 are identical in characteristics, and so are transistors M3 and M4, and transistors M5 and M6. Herein, "identical in characteristics" means "equal in threshold voltage, gain constant, transconductance provided when a uniform current flows, and in drain resistance."

Transistors M3 and M5 have their respective drains connected together at a point connected to a first output terminal. Transistors M4 and M6 have their respective drains connected together at a point connected to a second output terminal. Transistors M3 and M4 have their respective sources connected together at a point connected to transistor M2 at the drain.

Transistors M5 and M6 have their respective sources connected together at a point connected to transistor M1 at the drain.

Transistor M1 is provided with a gate terminal Vc1 connected to control circuit 400 and has its source connected to a first fixed potential (a ground potential). Transistor M2 is provided with a gate terminal Vc2 connected to control circuit 400 and has its source connected to the first fixed potential (the ground potential).

Transistor M3 has its gate connected to its drain. Transistor M4 has its gate connected to its drain. Transistor M6 has its gate connected to a first input terminal IN1. Transistor M5 has its gate connected to a second input terminal IN2.

Resistance Z1 has one end connected to a second fixed potential Vdd and the other end to a first output terminal OUT1. Resistance Z2 has one end connected to the second fixed potential Vdd and the other end to a second output terminal OUT2.

Input terminals IN1 and IN2 have potentials Vin− and Vin+, respectively, and output terminals OUT1 and OUT2 have potentials Vout+ and Vout−, respectively, and transistors M1 and M2 pass currents I1 and I2, respectively, for the sake of illustration.

Figure 6:
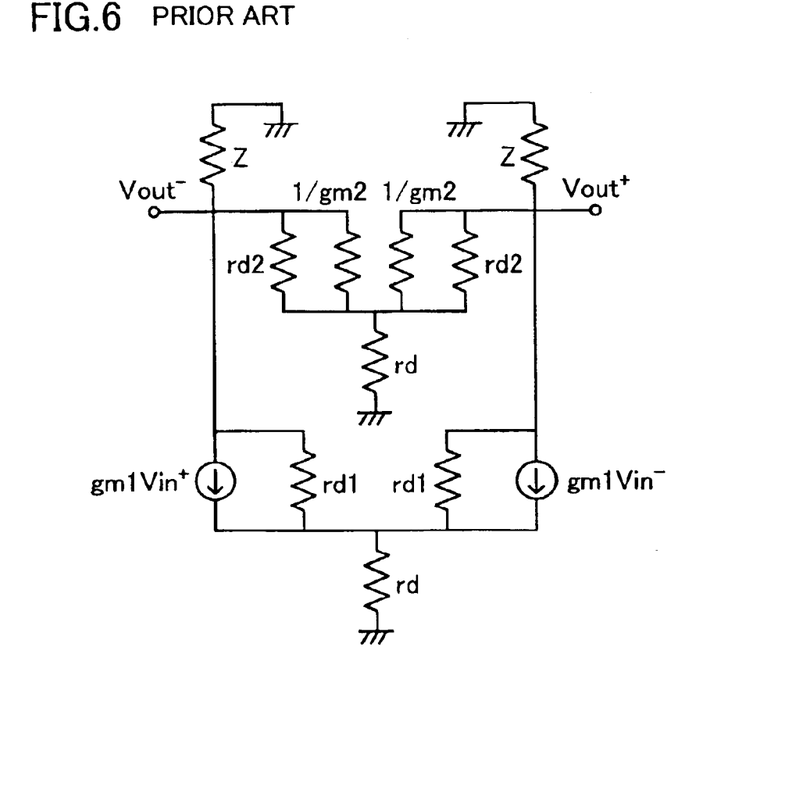
FIG. 6 shows a circuit equivalent to amplification circuit 100.

FIG. 6 shows a circuit equivalent to the amplification circuit. In the figure, gm1 represents transconductance of transistors M5 and M6, gm2 represents transconductance of transistors M3 and M4, rd1 represents drain resistance of transistors M5 and M6, rd2 represents drain resistance of transistors M3 and M4, and Z represents resistance of load resistances Z1 and Z2. From this figure, the amplification circuit has a gain gain, as represented by the following equation:

$$\text{gain} = \left| \left( \frac{(Vout^+ - Vout^-)}{(Vin^+ - Vin^-)} \right) \right| \quad (A1)$$

$$= gm1 \cdot \left( rd1 \, // \, rd2 \, // \, \frac{1}{gm2} \, // \, Z \right),$$

wherein // indicates an operation performed to calculate combined resistance of parallel connection. If rd1, rd2>>1/gm2, Z then gain is approximated, as follows:

$$\text{gain} \cong gm1 \cdot \left( \frac{1}{gm2} \, // \, Z \right) \quad (A2)$$

$$= gm1 \cdot \left( \frac{\frac{Z}{gm2}}{Z + \frac{1}{gm2}} \right)$$

$$= \frac{gm1}{gm2} \cdot \frac{1}{\frac{1}{Z \cdot gm2} + 1}.$$

If $\mu_n$ represents an average surface mobility, Cox represents a gate capacitance per unit area, $(W/L)_1$ represents a channel width/a channel length of transistors M5 and M6, and $(W/L)_2$ represents a channel width/a channel length of transistors M3 and M4, then gm1 and gm2 are represented by the following equations:

$$gm1 = \sqrt{UnCox\left(\frac{W}{L}\right)_1 \cdot I1} \quad (A3)$$

$$gm2 = \sqrt{UnCox\left(\frac{W}{L}\right)_2 \cdot I2}. \quad (A4)$$

By substituting expressions A3 and A4 into expression A2, the following expression:

$$\text{gain} \cong \frac{\sqrt{UnCox\left(\frac{W}{L}\right)_1 \cdot I1}}{\sqrt{UnCox\left(\frac{W}{L}\right)_2 \cdot I2}} \times \frac{1}{\frac{1}{Z\sqrt{UnCox\left(\frac{W}{L}\right)_2 \cdot I2}}} \quad (A5)$$

is obtained.

From expression A5, if Z is sufficiently large, then an expression:

$$\text{gain} \propto (I1/I2)^{0.5} \quad (A6)$$

is provided and gain is proportional to a square root of a ratio of current I1 to current I2.

Control circuit 400 is configured, as described hereinafter. Control circuit 400 includes p-channel MOS transistors M21 and M22, n-channel MOS transistors M11 and M12, and a constant current source Ibias1. Herein, transistors M11 and M12 are identical in characteristics, and so are transistors M21 and M22.

Constant current source Ibias1 outputs a constant current Ibs1.

Transistors M21 has its source connected to constant current source Ibias1, its drain connected to transistor M11 at the drain, and its gate receiving a control voltage Vcon1.

Transistor M22 has its source connected to constant current source Ibias1, its drain connected to transistor M12 at the drain, and its gate receiving a control voltage Vcon2.

Transistor M11 has its source connected to a first fixed potential (a ground potential), its drain connected to its gate and transistor M21 at the drain, and gate terminal Vc1 connected to gate terminal Vc1 of transistor M1 of amplification circuit 100.

Transistor M12 has its source connected to the first fixed potential (the ground potential), its drain to its gate and transistor M22 at the drain, and gate terminal Vc2 to gate terminal Vc2 of transistor M2 of amplification circuit 100.

Constant current source Ibias1 has one end connected to a second fixed potential Vdd and the other end to transistors M21 and M22 at their respective sources.

Control circuit 400 operates, as described hereinafter. Transistors M21 and M22 are provided with a gain constant K and a threshold voltage Vth for the sake of illustration. Transistors M21 and M22 pass currents Id1 and Id2, respectively, and their respective gate-source voltages are represented as Vgs1 and Vgs2, respectively, for the sake of illustration. Currents Id1 and Id2 are represented by the following equations:

$$Ibs1 = Id1 + Id2 \quad (A7)$$

$$Id1 = K \times (Vgs1 - Vth)^2 \quad (A8)$$

$$Id2 = K \times (Vgs2 - Vth)^2 \quad (A9).$$

Herein, if a point S has a potential Vs then the following equations:

$$Vgs1 = Vcon1 - Vs \quad (A10)$$

$$Vgs2 = Vcon2 - Vs \quad (A11)$$

are established.
Herein, if $$Vcon = Vcon2 - Vcon1 \quad (A12)$$

then from expressions A7–A12 the following expressions:

$$\sqrt{K}\, Vcon = \sqrt{Ibs1 - Id1} - \sqrt{Id1} \quad (A13)$$

$$= \sqrt{Id2} - \sqrt{Ibs1 - Id2} \quad (A14)$$

are obtained.

Expressions A13 and A14 are transformed to obtain the following two expressions:

$$Id1 = \frac{1}{2}\left[Ibs1 + \sqrt{2Ibs1 \cdot K - (K \cdot Vcon)^2} \cdot Vcon\right] \quad (A15)$$

$$Id2 = \frac{1}{2}\left[Ibs1 - \sqrt{2Ibs1 \cdot K - (K \cdot Vcon)^2} \cdot Vcon\right]. \quad (A16)$$

Figure 7:
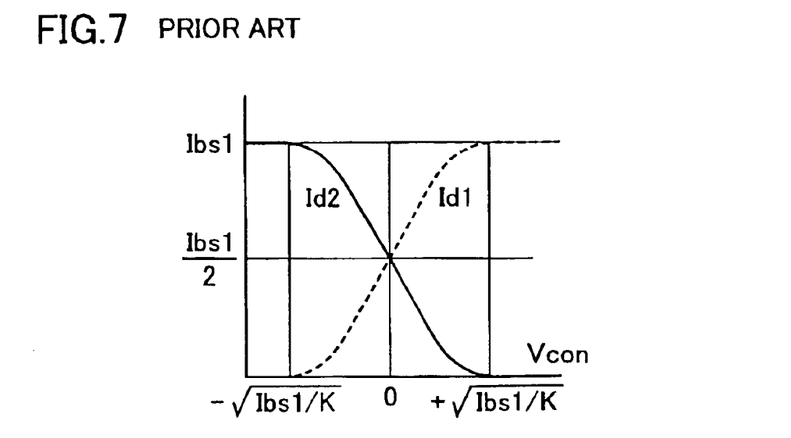
FIG. 7 represents a relationship between Vcon, and Id1 and Id2.

FIG. 7 represents a relationship between Vcon, and Id1 and Id2. As shown in the figure, in a vicinity of Vcon=0, Id1 is directly proportional to Vcon and Id2 is directly proportional to −Vcon.
If $$A = \frac{1}{2} Ibs1 \quad (A17)$$

$$B = \frac{1}{2} \sqrt{2Ibs1 \cdot K - (K \cdot Vcon)^2} \quad (A18)$$

then from expressions A15–A18 currents Id1 and Id2 are represented by the following equations:

$$Id1 = A + B \times Vcon \quad (A19)$$

$$Id2 = A - B \times Vcon \quad (A20).$$

Current Id1 also flows through transistor M11. Since transistors M11 and M1 configure a current mirror circuit, current Id1 also flows through transistor M1. Therefore I1=Id1. Furthermore, current Id2 also flows through transistor M12. Since transistors M12 and M2 configure a current mirror circuit, current Id2 also flows through transistor M2. Therefore I2=Id2.

$$C = \frac{B}{A} = \frac{\sqrt{2Ibs1 \cdot K - (K \cdot Vcon)^2}}{Ibs1} \quad (A21)$$

is provided and from expressions A6 and A19–A21 gain is represented by the following equation:

$$\begin{aligned}
\text{gain} &\propto \left(\frac{I1}{I2}\right)^{0.5} = \left(\frac{Id1}{Id2}\right)^{0.5} \quad (A22)\\
&= \left(\frac{A + B \cdot Vcon}{A - B \cdot Vcon}\right)^{0.5}\\
&= \left(\frac{1 + C \cdot Vcon}{1 - C \cdot Vcon}\right)^{0.5}.
\end{aligned}$$

In general, an exponential function is approximated by the following expression:

$$\exp(2nx) \approx \{(1+x)/(1-x)\}^n \quad (A23).$$

If $$Vcon' = C \times Vcon \quad (A24)$$

and approximation A23 for n=0.5 is applied to expression A22, then $$\text{gain} \propto \exp(Vcon') \quad (A25).$$

This indicates that the gain is proportional to an exponential function of a control voltage. If the gain is represented in dB then it exhibits a linear in dB characteristic relative the control voltage. A variable gain amplifier allowing a gain to have a linear in dB characteristic relative to a control voltage is referred to as a linear gain amplifier.

Approximation A23 for n=0.5, however, is established only in a small range. More specifically, for Y1={(1+x)/(1−x)}$^{0.5}$ and Y2=exp(x), Y1 that allows an approximation Y1≈Y2 to be established has a small range. In other words, for the above described, conventional variable gain amplifier, a gain exhibits a linear in dB characteristic relative to a control voltage in a small range.

SUMMARY OF THE INVENTION

The present invention contemplates a variable gain amplifier allowing a gain to exhibit a linear in dB characteristic relative to a control voltage over a range wider than conventional.

The present invention in one aspect provides a variable gain amplifier including: an amplification circuit including first and second MOS transistors identical in characteristics and having respective sources connected to a first fixed potential, the amplification circuit having a differential gain proportional to a square root of a ratio between a current flowing through the first MOS transistor and a current flowing through the second MOS transistor; and a control circuit applying a potential corresponding to a constant voltage plus a control voltage to a gate of the first MOS transistor and a potential corresponding to the constant voltage minus the control voltage to a gate of the second MOS transistor.

As such, when the constant voltage and the control voltage are represented as Vb and Vcon, respectively, the first MOS transistor has its gate receiving a potential Vb+Vcon and the second MOS transistor has its gate-receiving a potential Vb−Vcon. As such, the first MOS transistor passes current I1 represented in the order of (Vb+Vcon)$^2$ and the second MOS transistor passes current I2 represented in the order of (Vb−Vcon)$^2$ so that a gain can exhibit A linear in dB characteristic for the control voltage over a range wider than conventional.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present invention in embodiments will be described with reference to the drawings.
First Embodiment The present embodiment relates to a variable gain amplifier allowing a gain to exhibit a linear in dB characteristic relative to a control voltage over a range wider than conventional.
Configuration With reference to FIG. 1, the present embodiment provides a variable gain-amplifier configured of an amplification circuit 100 and a control circuit 200. Amplification circuit 100 will not be described as it is identical to the conventional amplification circuit shown in FIG. 5.

Figure 1:
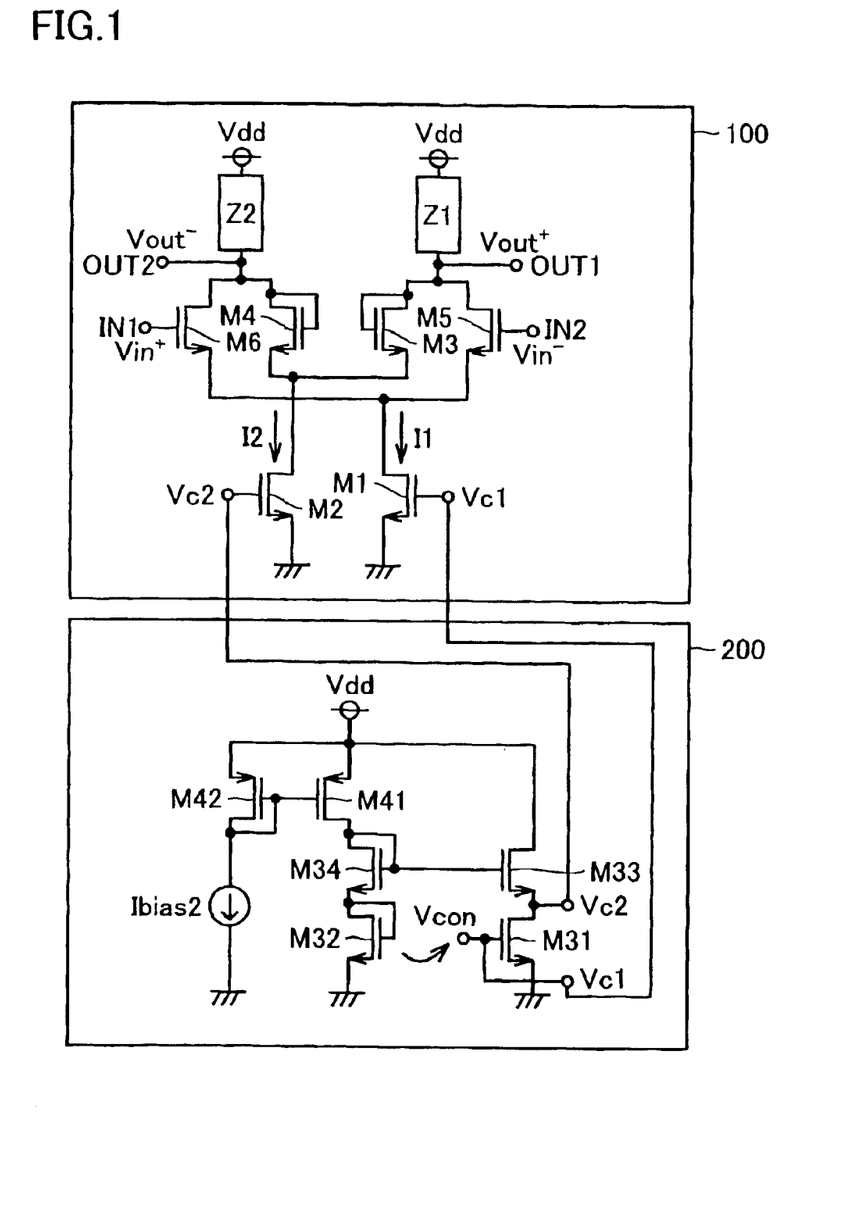
FIG. 1 shows a configuration of a variable gain amplifier of an embodiment of the present invention.

Control circuit 200 includes n-channel MOS transistors M3–M34 (seventh to tenth MOS transistors, respectively), p-channel MOS transistors M41 and M42, and a constant current source Ibias2. Herein, transistors M31 and M33 are identical in characteristics, and so are transistors M32 and M34, and transistors M41 and M42.

Constant current source Ibias2 outputs a constant current Ibs2.

Transistor M31 has its source connected to a first fixed potential (a ground potential) and its drain connected to transistor M33 at the source. Transistor M31 is provided with a drain terminal Vc2 connected to a gate terminal Vc2 of transistor M2 of amplification circuit 100. Furthermore, transistor M31 is provided with a gate terminal Vc1 connected to a gate terminal Vc1 of transistor M1 of amplification circuit 100. Gate terminal Vc1 receives a gate voltage Vg32 of transistor M32 plus a control voltage Vcon.

Transistor M33 has its source connected to transistor M31 at the drain, its drain connected to a second fixed potential Vdd, and its gate connected to transistor M34 at the gate. Transistors M31 and M33 configures a level shift circuit.

Transistor M32 has its source connected to a first fixed potential (a ground potential), its drain connected to transistor M34 at the source, and its gate connected to its drain.

Transistor M34 has its source connected to transistor M32 at the drain, its drain connected to its gate and transistor M41 at the drain, and its gate connected to transistor M33 at the gate.

Transistor M41 has its source connected to the second fixed potential Vdd, its drain connected to transistor M34 at the drain, and its gate connected to transistor M42 at the gate.

Transistor M42 has its source connected to the second fixed potential Vdd, its drain connected to its gate and constant current source Ibias2, and its gate connected to transistor M41 at the gate. Transistors M41 and M42 configures a current mirror circuit.

Operation

Control circuit 200 operates, as will be described hereinafter. All transistors operate in a saturation range for the sake of illustration.

Transistors M41 and M42 configure a current mirror circuit. Since transistors M41 and M42 are identical in characteristics, they have their respective drains both passing a current Id represented by Ibs2. Accordingly, transistors M34 and M32 also have their respective drains passing current Id represented by Ibs2.

Since transistors M32 and M34 are identical in characteristics, their gain constant and threshold are represented as K and V, respectively. Gate-source voltages Vgs 32 and Vgs 34 of transistors M32 and M34, respectively, are represented as follows:

$$Vgs32 = Vgs34 = \sqrt{\frac{Ibs2}{K}} + Vth \qquad (B1)$$

Herein, if $$Vb = \sqrt{\frac{Ibs2}{K}} + Vth \qquad (B2)$$

then the following equation:

$$Vgs32 = Vgs34 = Vb \qquad (B3)$$

is obtained.

Since transistor M32 has its source grounded, transistor M32 has a gate voltage Vg32 based on expression B3, as follows:

$$Vg32 = Vgs32 = Vb \qquad (B4).$$

Furthermore, since the transistor M32 gate and the transistor M34 source are connected together, transistor M34 has a gate voltage Vg34 based on expressions B3 and B4, as follows:

$$Vg34 = Vg32 + Vgs34 = 2Vb \quad (B5).$$

Transistors M31 and M33 configure a level shift circuit. Since transistors M31 and M33 are identical in characteristics, their respective gate-source voltages Vgs31 and Vgs33 are represented as follows:

$$Vgs31 = Vgs33 \quad (B6).$$

Furthermore, since transistor M31 has its source grounded, the following expression:

$$Vg31 = Vgs31 \quad (B7)$$

is established.

From expressions B6 and B7, the following expression:

$$Vc2 = Vg33 - Vgs33 = Vg33 - Vg3 \quad (B8)$$

is obtained.

Since the transistor M33 gate is connected to the transistor M34 gate, transistor M33 has a gate voltage Vg33 based on expression B5, as follows:

$$Vg33 = Vg34 = 2Vb \quad (B9).$$

When control voltage Vcon is applied between the transistor M31 gate and the transistor M32 gate, from expression B4 the following equation:

$$Vc1 = Vg31 = Vg32 + Vcon = Vb + Vcon \quad (B10)$$

is obtained.

From expressions B8–B10, the following equation:

$$Vc2 = 2Vb - (Vb + Vcon) = Vb - Vcon \quad (B11)$$

is obtained.

In amplification circuit 100 transistor M1 passes current I1 based on expression B10, as represented by:

$$I1 = K(Vgs1 - Vth)^2 = K(Vc1 - Vth)^2 = K(Vb + Vcon - Vth)^2 \quad (B12).$$

Similarly, in amplification circuit 100 transistor M2 passes current I2 based on expression B11, as represented by:

$$I2 = K(Vgs2 - Vth)^2 = K(Vc2 - Vth)^2 = K(Vb - Vcon - Vth)^2 \quad (B13).$$

From expressions A6, B12 and B13, gain is expressed as follows:

$$\text{gain} \propto \left(\frac{I1}{I2}\right)^{0.5} \quad (B14)$$

$$= \left\{\frac{K(Vb + Vcon - Vth)^2}{K(Vb - Vcon - Vth)^2}\right\}^{0.5}$$

$$= \frac{Vb + Vcon - Vth}{Vb - Vcon - Vth}$$

$$= \frac{1 + \frac{Vcon}{Vb - Vth}}{1 - \frac{Vcon}{Vb - Vth}}.$$

If $$Vcon' = Vcon/(Vb - Vth) \quad (B15)$$

and n=1, and for expression B14 approximation A23 is used, then $$\text{gain} \propto \exp(2Vcon') \quad (B16).$$

While for a conventional variable gain amplifier gain is approximated by approximation A23 for n=0.5, for the variable gain amplifier of the present embodiment gain is approximated by approximation A23 for n=1.

Figure 2:
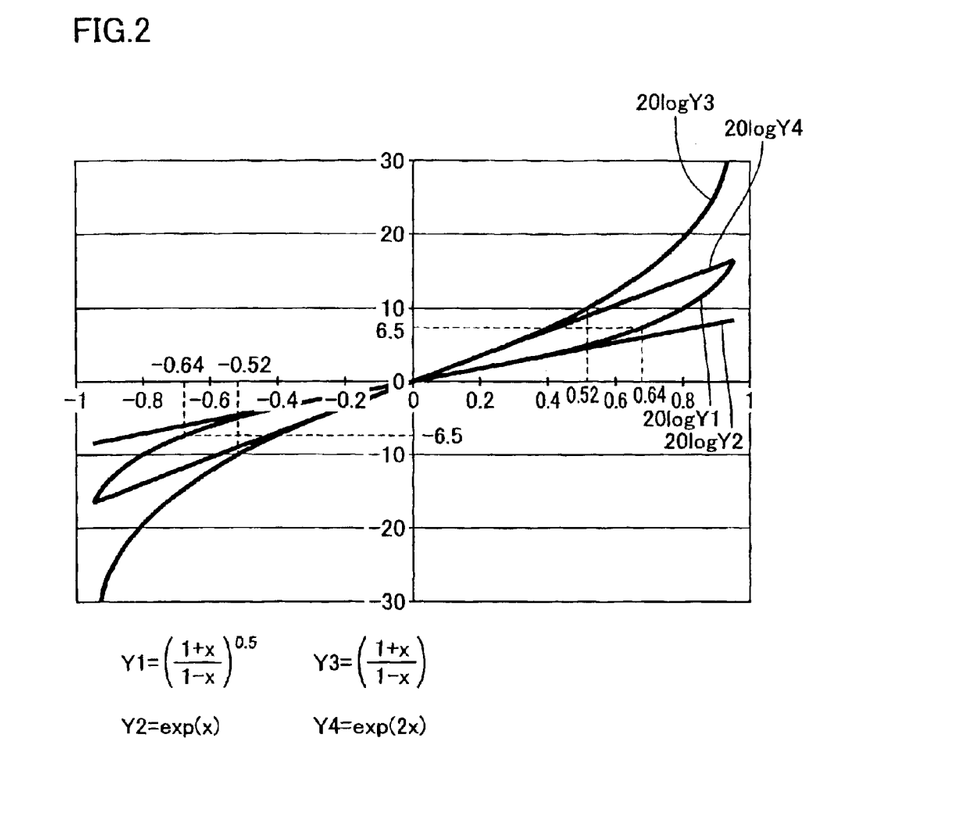
FIG. 2 represents a range of a linear in dB in each of a variable gain amplifier of an embodiment of the present invention and a conventional variable gain amplifier.

The variable gain amplifier of the present embodiment and the conventional variable gain amplifier each have a gain exhibiting a linear in dB relative to a control voltage over a range, as will now be described with reference to FIG. 2. In the figure Y1={(1+x)/(1-x)}$^{0.5}$, Y2=exp(x), Y3={(1+x)/(1-x)}$^{1}$ and Y4=exp(2x), and Y1–Y4 are represented in dB.

For the conventional variable gain amplifier, Y1 is approximated by Y2, and the range of x allowing 20×logY1 and 20×logY2 to have a difference of no more than ±1 dB (i.e., a range allowing approximation) is −0.64<x<0.64, and the range of 20×logY1 that corresponds to this range of x is −6.5 dB to 6.5 dB.

In contrast, for the variable gain amplifier of the present embodiment, Y3 is approximated by Y4, and the range of x allowing 20×logY1 and 20×logY2 to have the difference of no more than ±1 dB (i.e., a range allowing approximation) is −0.52<x<0.52, and the range of 20×logY3 that corresponds to this range of x is −10 dB to 10 dB.

In other words, for the conventional variable gain amplifier, a linear in dB characteristic is obtained only over the range of −6.5 dB to 6.5dB, whereas for the variable gain amplifier of the present embodiment, a linear in dB characteristic is obtained over a range wider than conventional, i.e., −10 dB to 10 dB.

Thus in the variable gain amplifier of the present embodiment transistors M1 and M2 have their respective gates receiving potentials Vb+Vcon and Vb−Vcon, respectively, to allow transistors M1 and M2 to pass currents I1 and I2 represented in orders of (Vb+Vcon)$^2$ and (Vb−Vcon)$^2$, respectively, so that in expression A23 an approximation for n=1 can be established and a gain can exhibit a linear in dB characteristic relative to a control voltage over a range wider than conventional.

Second Embodiment

The present embodiment relates to a variable gain amplifier that allows a gain to exhibit a linear in dB characteristic relative to a control voltage over a range wider than conventional.

Figure 3:
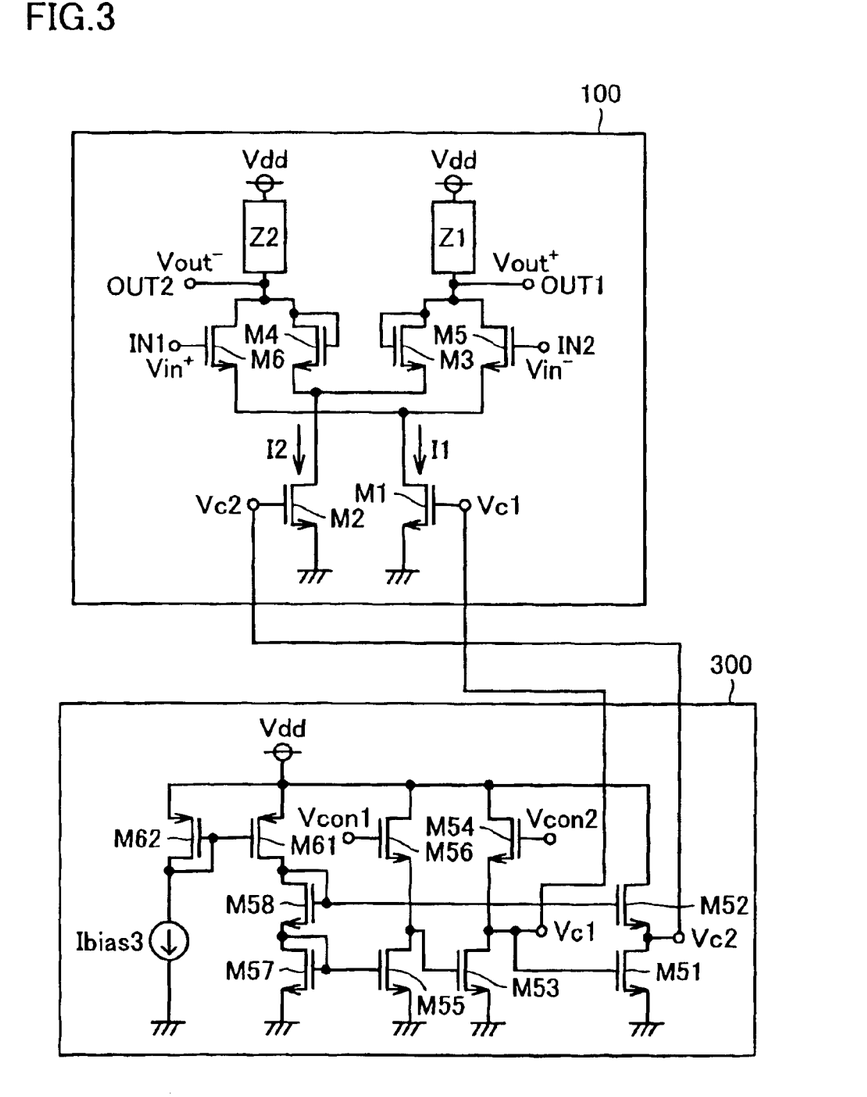
FIG. 3 shows a configuration of a variable gain amplifier of an embodiment of the present invention.

Configuration With reference to FIG. 3, the present embodiment provides a variable gain amplifier configured of amplification circuit 100 and a control circuit 300. Amplification circuit 100 will not be described as it is identical to the conventional amplification circuit shown in FIG. 5 and the amplification circuit shown in FIG. 1.

Control circuit 300 includes p-channel MOS transistors M61 and M62, n-channel MOS transistors M51–M58 (11th to 18th MOS transistors, respectively), and a constant current source Ibias3.

Transistors M51 and M52 are identical in characteristics, and so are transistors 53 and M54, transistors M55 and M56, transistors M57 and M58, and transistors M61 and M62.

Constant current source Ibias3 outputs a constant current Ibs3.

Transistor M51 has its source connected to a first fixed potential (a ground potential), its drain connected to transistor M52 at the source, and its gate connected to transistor M53 at the drain. Transistor M51 is provided with a drain terminal Vc2 connected to gate terminal Vc2 of transistor M2 of amplification circuit 100. Furthermore transistor M51 is provided with a gate terminal Vc1 connected to gate terminal Vc1 of transistor M1 of amplification circuit 100.

Transistor M52 has its source connected to transistor M51 at the drain, its drain to a second fixed potential Vdd, and its gate to transistor M58 at the gate. Transistors M51 and M52 configure a level shift circuit.

Transistor 53 has its source connected to a first fixed potential (a ground potential), its drain to transistor 54 at the source and transistor M51 at the gate, and its gate connected to transistor M55 at the drain.

Transistor M54 has its source connected to transistor M53 at the drain, its drain to the second fixed potential Vdd, and its gate receiving a control voltage Vcon2. Transistors M53 and M54 configure a level shift circuit.

Transistor M55 has its source connected to the first fixed potential (a ground potential), its drain to transistor M56 at the source and transistor M53 at the gate, and its gate to transistor M57 at the drain.

Transistor M56 has its source connected to transistor M55 at the drain and transistor M53 at the gate, its drain to the second fixed potential Vdd, and its gate receiving a control voltage Vcon1. Transistors M55 and M56 configure a level shift circuit.

Transistor M57 has its source connected to the first fixed potential (a ground potential), its drain to transistor M58 at the source and its gate, and its gate to transistor M55 at the gate.

Transistor M58 has its source connected to transistor M57 at the drain, its drain to transistor M61 at the drain and its gate, and its gate to transistor M52 at the gate.

Transistor M61 has its source connected to the second fixed potential Vdd, its drain to transistor M58 at the drain, and its gate to transistor M62 at the gate.

Transistor M62 has its source connected to the second fixed potential Vdd, its drain to its gate and constant current source Ibias3, and its gate to transistor M61 at the gate. Transistors M61 and M62 configure a current mirror circuit.

Operation

Control circuit 300 operates as described hereinafter. All transistors operate in a saturation range for the sake of illustration.

Transistors M61 and M62 configure a current mirror circuit. Since transistors M61 and M62 are identical in characteristics, they have their respective drains both passing a current Id represented by Ibs3. Accordingly, transistors M58 and M57 also have their respective drains passing current Id represented by Ibs3.

Since transistors M57 and M58 are identical in characteristics, their gain constant and threshold are represented as K and V, respectively. Gate-source voltages Vgs 57 and Vgs 58 of transistors M57 and M58, respectively, are represented as follows:

$$Vgs57 = Vgs58 = \sqrt{\frac{Ibs3}{K}} + Vth \tag{C1}$$

Herein, if $$Vb = \sqrt{\frac{Ibs3}{K}} + Vth \tag{C2}$$

then $$Vgs57 = Vgs58 = Vb \tag{C3}$$

Since transistor M57 has its source grounded, transistor M57 has a gate voltage Vg57 based on expression C3, as follows:

$$Vg57 = Vgs57 = Vb \tag{C4}$$

Furthermore, since the transistor M57 gate and the transistor M58 source are connected together, transistor M58 has a gate voltage Vg58 based on expressions C3 and C4, as follows:

$$Vg58 = Vg57 + Vgs57 = 2\, Vb \tag{C5}$$

Transistors M55 and M56 configure a level shift circuit. Since transistors M55 and M56 are identical in characteristics, their respective gate-source voltages Vgs55 and Vgs56 are represented as follows:

$$Vgs55 = Vgs56 \tag{C6}$$

Furthermore, since transistor M55 has its source grounded, the following expression:

$$Vg55 = Vgs55 \tag{C7}$$

is established.

Furthermore, since transistors M55 and M57 have their respective gates connected together, the following expression:

$$Vg55 = Vg57 = Vb \tag{C8}$$

is established.

If transistor M55 has a drain voltage Vd55, then from expressions C6 and C7 the following expression:

$$Vd55 = Vg56 - Vgs56 = Vg56 - Vg55 \tag{C9}$$

is obtained.

Furthermore, transistors M53 and M54 configure a level shift circuit. Since transistors M53 and M54 are identical in characteristics, their respective gate-source voltages Vgs53 and Vgs54 are represented as follows:

$$Vgs53 = Vgs54 \tag{C10}$$

Furthermore, since transistor M53 has its source grounded, the following expression:

$$Vg53 = Vgs53 \tag{C11}$$

is established.

Since the transistor M53 drain is connected to transistor M54 source, if transistor M53 has a drain voltage Vd53 then the following expression:

$$Vd53 = Vg54 - Vgs54 \tag{C12}$$

is established.

From expressions C10–C12 the following expression:

$$Vd53 = Vg54 - Vg53 \tag{C13}$$

is obtained.

Furthermore, since the transistor M53 gate and the transistor M55 drain are connected together, the following expression:

$$Vg53 = Vd55 \tag{C14}$$

is established.

From expressions C9–C11, C13 and C14 the following expression:

$$Vd53 = Vg54 - Vgs53 \qquad (C15)$$
$$= Vg54 - Vg53$$
$$= Vg54 - Vd55$$
$$= Vg54 - (Vg56 - Vg55)$$
$$= Vg55 + (Vg54 - Vg56)$$

is obtained.

Herein if Vd53=Vc1, Vg54=Vcon2, and Vg56=Vcon1, then from expression C8 the following expression:

$$Vc1 = Vb + (Vcon2 - Vcon1) \qquad (C16)$$

is obtained.

Transistors M51 and M52 configure a level shift circuit. Since transistors M51 and M52 are identical in characteristics, their respective gate-source voltages Vgs51 and Vgs52 are represented as follows:

$$Vgs52 = Vgs51 \qquad (C17).$$

Since transistors M52 and M58 have their respective gates connected together, from expression C3 the following expression:

$$Vg52 = Vg58 = 2\,Vb \qquad (C18)$$

is established. Furthermore, since transistor M51 has its source grounded, the following expression:

$$Vg51 = Vgs51 \qquad (C19)$$

is established. Since the transistor M51 drain and the transistor M52 source are connected together, the following expression:

$$Vd51 = Vg52 - Vgs52 \qquad (C20)$$

is established.

From expressions C17, C19 and C20 the following expression:

$$Vd51 = Vg52 - Vg51 \qquad (C21)$$

is obtained. Herein, if Vd51=Vc2, and Vg51=Vc1, then from expressions C16, C18 and C21 the following expression:

$$Vc2 = Vg52 - Vc1 \qquad (C22)$$
$$= 2Vb - Vc1$$
$$= 2Vb - \{Vb + (Vcon2 - Vcon1)\}$$
$$= Vb - (Vcon2 - Vcon1)$$

is obtained.

Herein if $$Vcon = Vcon2 - Vcon1 \qquad (C23)$$

then the following expressions:

$$Vc1 = Vb + Vcon \qquad (C24)$$

$$Vc2 = Vb - Vcon \qquad (C25)$$

are obtained.

In amplification circuit 100 transistor M1 passes current I1 based on expression C24, as represented by:

$$I1 = K(Vgs1 - Vth)^2 = K(Vc1 - Vth)^2 = K(Vb + Vcon - Vth)^2 \qquad (C26).$$

Similarly in amplification circuit 100 transistor M2 passes current I2 based on expression C25, as represented by:

$$I2 = K(Vgs2 - Vth)^2 = K(Vc2 - Vth)^2 = K(Vb - Vcon - Vth)^2 \qquad (C27).$$

From expression A6, C26 and C27, gain is represented by the following expression:

$$\text{gain} \propto \left(\frac{I1}{I2}\right)^{0.5} \qquad (C28)$$
$$= \left\{\frac{K(Vb + Vcon - Vth)^2}{K(Vb - Vcon - Vth)^2}\right\}^{0.5}$$
$$= \frac{Vb + Vcon - Vth}{Vb - Vcon - Vth}$$
$$= \frac{1 + \dfrac{Vcon}{Vb - Vth}}{1 - \dfrac{Vcon}{Vb - Vth}}.$$

If $$Vcon' = Vcon/(Vb - Vth) \qquad (C29)$$

and to expression C28 approximation A23 for n=1 is applied then:

$$\text{gain} \propto \exp(2Vcon') \qquad (C30).$$

As such, as well as for the variable gain amplifier of the first embodiment, for that of the present embodiment gain is approximated by approximation A23 for n=1.

Thus in the variable gain amplifier of the present embodiment transistors M1 and M2 have their respective gates receiving potentials Vb+Vcon and Vb−Vcon, respectively, to allow transistors M1 and M2 to pass currents I1 and I2 represented in orders of (Vb+Vcon)² and (Vb−Vcon)², respectively, so that in expression A23 an approximation for n=1 can be established and a gain can exhibit a linear in dB characteristic relative to a control voltage over a range wider than conventional.

Furthermore in the present embodiment the variable gain amplifier allows a gain to be controlled by a differential value Vcon of two control Vcon2 and Vcon1. As such, if the variable gain amplifier is configured of MOS transistors having characteristics (e.g., threshold voltage, size and the like) more or less varying, adjusting Vcon2 and Vcon1 in absolute value while maintaining differential value Vcon allows the variation to be absorbed.

Third Embodiment

If in the first embodiment, expression B2 is substituted into expression B14, then gain is expressed by:

$$\text{gain} \propto \frac{1 + \dfrac{Vcon}{\sqrt{\dfrac{Ibs2}{K}}}}{1 - \dfrac{Vcon}{\sqrt{\dfrac{Ibs2}{K}}}}. \qquad (D1)$$

Herein, in general, an MOS transistor's gain constant varies in the order of the −3/2 power of temperature. Accordingly, when temperature varies, in expression D1 the transistors M31 and M32 gain constant K also varies and accordingly the variable gain amplifier's gain varies.

As such, if Ibs2 is proportional to a gain constant K' of any MOS transistor, which may be other than transistors M32 and M34, then K'/K allows an item related to temperature variation to be cancelled and if temperature varies the variable gain amplifier's gain can be maintained to be constant. The present embodiment relates to a variable gain amplifier including a constant current circuit outputting Ibs2 in proportion to gain constant K' of an MOS transistor.

Configuration

Figure 4:
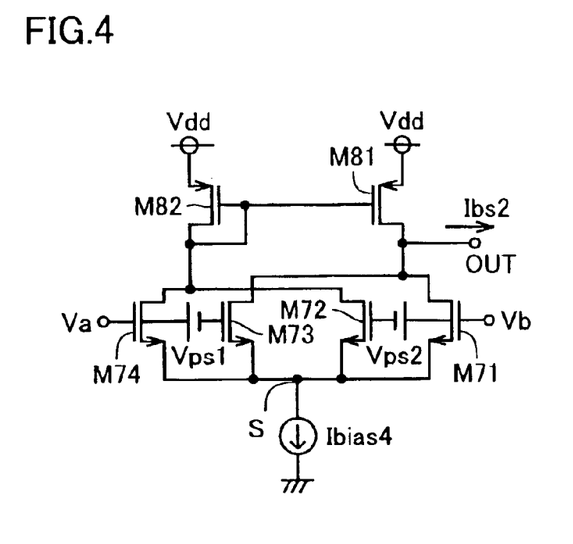
FIG. 4 shows a configuration of a constant current circuit used as a constant current source Ibias2 serving as a component of a control circuit.

The present embodiment provides a variable gain amplifier including an amplification circuit and a control circuit identical to those shown in FIG. 1. FIG. 4 shows a constant current circuit used as constant current source Ibias2 serving as a component of the control circuit shown in FIG. 1. The constant current circuit includes p-channel MOS transistors M81 and M82, n-channel MOS transistors M71–M74 (19th to 22nd MOS transistors, respectively), voltage sources Vps1 and Vps2, and a constant current source Ibias4. Transistors M81 and 82 are identical in characteristics, and so are transistors M71–M74.

Voltage sources Vps1 and Vps2 supply a voltage Vx. Constant current source Ibias4 outputs a constant current Ibs4.

Transistor M81 has its source connected to a second fixed potential Vdd, its drain to transistors M71 and M73 at the drains, respectively, and its gate to transistor M82 at the gate.

Transistor M82 has its source connected to the second fixed potential Vdd, its drain to its gate and transistors M72 and M74 at the drains, respectively, and its gate to transistor M82 at the gate. Transistors M81 and M82 configure a current mirror circuit.

Transistor M71 has its source connected to constant current source Ibias4, its drain to transistors M81 and M73 at the drains, respectively, and its gate to a fourth fixed potential Vb.

Transistor M73 has its source connected to constant current source Ibias4, its drain to transistors M81 and M71 at the drains, respectively, and its gate to a third fixed potential Va via voltage source Vps1.

Transistor M72 has its source connected to constant current source Ibias4, its drain to transistors M82 and M74 at the drains, respectively, and its gate to the fourth fixed potential Vb via voltage source Vps2.

Transistor M74 has its source connected to constant current source Ibias4, its drain to transistors M82 and M72 at the drains, respectively, and its gate to the third fixed potential Va at the gate.

Constant current source Ibias4 has one end connected to a first fixed potential (a ground potential) and the other end to transistors M71–M74 at the sources.

Operation

The constant current circuit operates, as described hereinafter. All transistors operate in a saturation range for the sake of illustration. Since transistors M71–M74 are identical in characteristics, their gain constant and threshold voltage are represented by K' and Vth, respectively.

Transistors M71–M74 have their respective drains passing currents Id71–Id74, respectively, for the sake of illustration. If their common source terminal represented as a point S has a potential Vs. then the following four expressions:

$$Id71=K'(Vb-Vs-Vth)^2 \tag{D2}$$

$$Id72=K'(Vb-Vx-Vs-Vth)^2 \tag{D3}$$

$$Id73=K'(Va-Vx-Vs-Vth)^2 \tag{D4}$$

$$Id74=K'(Va-Vs-Vth)^2 \tag{D5}$$

are established.

Furthermore, transistors M81 and M82 configure a current mirror circuit. Since transistors M81 and M82 are identical in characteristics, an output terminal OUT outputs a current Ibs2, as represented by the following equation:

$$Ibs2=(Id72+Id74)-(Id71+Id73) \tag{D6}.$$

By substituting expressions D2–D5 into expression D6, the following equation:

$$Ibs2=2K'\times Vx\times(Va-Vb) \tag{D7}$$

is obtained.

Output current Ibs2 proportional to gain constant K' is supplied to the drain of transistor M42 of FIG. 1.

Thus in the present embodiment the variable gain amplifier includes a constant current circuit outputting current Ibs2 proportional to gain constant K' of an MOS transistor. As such, even if temperature varies, a gain can be maintained to be constant.

Variation

The present invention is not limited to the above described embodiments and of course encompasses the following variations:

(1) The circuits described in the first and third embodiments can be operated, similarly as described above, if they have the p-channel MOS transistors replaced with n-channel MOS transistors and the n-channel MOS transistors replaced with p-channel MOS transistors;

(2) In the first embodiment, transistor M34 has its drain connected to a constant current circuit configured by a current mirror circuit formed of transistors M41 and M42 and constant current source Ibias2 (i.e., a circuit outputting constant current Ibs2) to supply transistor M41 with a constant current. However, the present invention is not limited thereto. For example, transistor M41 may have its drain directly connected to constant current source Ibias2. Furthermore, as described in the embodiment, transistors M41 and M42 configuring a current mirror circuit are identical in characteristics and transistor M41 passes a current set to be equal to the amount of current Ibs2 supplied from constant current source Ibias2. However, the present invention is not limited thereto. Any source that supplies a constant current can be used. For example, transistors M41 and M42 may be different in characteristics and transistor M34 may pass a current proportional to Ibs2;

(3) In the second embodiment, transistor M58 has its drain connected to a constant current circuit configured by a current mirror circuit formed of transistors M61 and M62 and constant current source Ibias3 (i.e., a circuit outputting constant current Ibs3) to supply transistor M58 with a constant current. However, the present invention is not limited thereto. For example, transistor M58 may have its drain directly connected to constant current source Ibias3. Furthermore, as described in the embodiment, transistors M61 and M62 configuring a current mirror circuit are identical in characteristics and transistor M58 passes a current set to be equal to the amount of current Ibs3 supplied from constant current source Ibias3. However, the present invention is not limited thereto. Any source that supplies a constant current can be used. For example, transistors M61 and M62 may be different in characteristics and transistor M58 may pass a current proportional to Ibs3;

(4) The constant current circuit of the third embodiment may be used as constant current source Ibias3 of the second embodiment. In this variation, an output current proportional to gain constant K' of an MOS transistor is supplied to the drain of transistor M62 shown in FIG. 3; and (5) The variable gain amplifier may include an amplification circuit other than those described in the first and second embodiments and the conventional example. The amplification circuit may have any configurations except that as well as those having been described, it includes transistors M1 and M2 and has a gain proportional to a square root of a ratio between current I1 flowing through transistor M1 and current I2 flowing through transistor M2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable gain amplifier comprising:
   an amplification circuit including first and second MOS transistors identical in characteristics and having respective sources connected to a first fixed potential, said amplification circuit having a differential gain proportional to a square root of a ratio between a current flowing through said first MOS transistor and a current flowing through said second MOS transistor; and
   a control circuit applying a potential corresponding to a constant voltage plus a control voltage to a gate of said first MOS transistor and a potential corresponding to said constant voltage minus said control voltage to a gate of said second MOS transistor.

2. The variable gain amplifier according to claim 1, wherein:
   said amplification circuit further includes third and fourth MOS transistors identical in characteristics, fifth and sixth MOS transistors identical in characteristics, and first and second loads equal in characteristics;
   said third and fifth MOS transistors have respective drains connected together at a point connected to a first output terminal;
   said fourth and sixth MOS transistors have respective drains connected at a point connected to a second output terminal;
   said third and fourth MOS transistors have respective sources connected together at a point connected to a drain of said second MOS transistor;
   said fifth and sixth MOS transistors have respective sources connected together at a point connected to a drain of said first MOS transistor;
   said first MOS transistor has its gate connected to said control circuit and its source connected to a first fixed potential;
   said second MOS transistor has its gate connected to said control circuit and its source connected to said first fixed potential;
   said third MOS transistor has a gate connected to its drain;
   said fourth MOS transistor has a gate connected to its drain;
   said sixth MOS transistor has a gate connected to a first input terminal;
   said fifth MOS transistor has a gate connected to a second input terminal;
   said first load has one end connected to a second fixed potential and the other end connected to said first output terminal; and
   said second load has one end connected to said second fixed potential and the other end connected to said second output terminal.

3. The variable gain amplifier according to claim 2, wherein:
   said control circuit includes seventh and eighth MOS transistors identical in characteristics, ninth and tenth MOS transistors identical in characteristics, and a first constant current circuit;
   said seventh MOS transistor has a source connected to said first fixed potential;
   said eighth MOS transistor has a source connected to a drain of said seventh MOS transistor and has a drain connected to said second fixed potential;
   said ninth MOS transistor has a source connected to said first fixed potential and has a drain connected to a gate thereof;
   said tenth MOS transistor has a source connected to the drain of said eighth MOS transistor, has a drain connected to a gate thereof and said first constant current circuit, and has its gate connected to a gate of said eighth MOS transistor;
   said seventh MOS transistor has its drain connected to the gate of said second MOS transistor; and
   said seventh MOS transistor has a gate connected to the gate of said first MOS transistor and receiving a voltage corresponding to a gate voltage of said ninth MOS transistor plus a control voltage.

4. The variable gain amplifier according to claim 3, wherein said first constant current circuit provides a current proportional in value to a gain constant of an MOS transistor.

5. The variable gain amplifier according to claim 4, wherein:
   said first constant current circuit includes 19th, 20th, 21st and 22nd MOS transistors identical in characteristics, a first voltage source, a second voltage source supplying a voltage equal to that of said first voltage source, and a second constant current circuit;
   said 19th to 22nd MOS transistors have respective sources connected together at a point connected to said second constant current circuit;
   said 19th and 21st MOS transistors have respective drains connected together;
   said 20th and 22nd MOS transistors have respective drains connected together;
   said 19th MOS transistor has a gate connected to a third fixed potential;
   said 22nd MOS transistor has a gate connected to a fourth fixed potential;
   said 20th MOS transistor has a gate connected to said third fixed potential through said first voltage source;
   said 21st MOS transistor has a gate connected to said fourth fixed potential through said second voltage source; and
   said first constant current circuit outputs a current corresponding to a difference between a sum of a drain current of said 19th MOS transistor and a drain current of said 21st MOS transistor and a sum of a drain current of said 20th MOS transistor and a drain current of said 22nd MOS transistor.

6. The variable gain amplifier according to claim 2, wherein:

said control circuit includes 11th and 12th MOS transistors identical in characteristics, 13th and 14th MOS transistors identical in characteristics, 15th and 16th MOS transistors identical in characteristics, 17th and 18th MOS transistors identical in characteristics, and a first constant current circuit;

said 11th MOS transistor has a source connected to said first fixed potential;

said 12th MOS transistor has a source connected to a drain of said 11th MOS transistor and has a drain connected to said second fixed potential;

said 13th MOS transistor has a source connected to said first fixed potential and has a drain connected to a gate of said 11th MOS transistor;

said 14th MOS transistor has a source connected to the drain of said 13th MOS transistor and has a drain connected to said second fixed potential;

said 15th MOS transistor has a source connected to said first fixed potential and has a drain connected to a gate of said 13th MOS transistor;

said 16th MOS transistor has a source connected to the drain of said 15th MOS transistor and the gate of said 13th MOS transistor and has a drain connected to said second fixed potential;

said 17th MOS transistor has a source connected to said first fixed potential, has a drain connected to a gate thereof, and has its gate connected to a gate of said 15th MOS transistor;

said 18th MOS transistor has a source connected to the drain of said 17th MOS transistor, has a drain connected to said first constant current circuit and a gate thereof, and has its gate connected to a gate of said 12th MOS transistor;

said 11th MOS transistor has its drain connected to the gate of said second MOS transistor;

said 11th MOS transistor has its gate connected to the gate of said first MOS transistor;

said 16th MOS transistor has a gate receiving a first control voltage; and said 14th MOS transistor has a gate receiving a second control voltage.

7. The variable gain amplifier according to claim 6, wherein said first constant current circuit provides a current proportional in value to a gain constant of an MOS transistor.

8. The variable gain amplifier according to claim 7, wherein:

said first constant current circuit includes 19th, 20th, 21st and 22nd MOS transistors identical in characteristics, a first voltage source, a second voltage source supplying a voltage equal to that of said first voltage source, and a second constant current circuit;

said 19th to 22nd MOS transistors have respective sources connected together at a point connected to said second constant current circuit;

said 19th and 21st MOS transistors have respective drains connected together;

said 20th and 22nd MOS transistors have respective drains connected together;

said 19th MOS transistor has a gate connected to a third fixed potential;

said 22nd MOS transistor has a gate connected to a fourth fixed potential;

said 20th MOS transistor has a gate connected to said third fixed potential through said first voltage source;

said 21st MOS transistor has a gate connected to said fourth fixed potential through said second voltage source; and said first constant current circuit outputs a current corresponding to a difference between a sum of a drain current of said 19th MOS transistor and a drain current of said 21st MOS transistor and a sum of a drain current of said 20th MOS transistor and a drain current of said 22nd MOS transistor.

* * * * *